United States Patent
Won et al.

(10) Patent No.: US 9,484,377 B2
(45) Date of Patent: Nov. 1, 2016

(54) CMOS IMAGE SENSOR INCLUDING INFRARED PIXELS HAVING IMPROVED SPECTRAL PROPERTIES, AND METHOD OF MANUFACTURING SAME

(71) Applicant: SiliconFile Technologies Inc., Seongnam-si, Gyeonggi-do (KR)

(72) Inventors: Jun Ho Won, Seoul (KR); Won Ho Lee, Seoul (KR); Do Young Lee, Seongnam-si (KR)

(73) Assignee: SiliconFile Technologies Inc., Gyeonggi-do (KR)

( * ) Notice: Subject to any disclaimer, the term of this patent is extended or adjusted under 35 U.S.C. 154(b) by 0 days.

(21) Appl. No.: 14/649,710

(22) PCT Filed: Nov. 15, 2013

(86) PCT No.: PCT/KR2013/010396
§ 371 (c)(1),
(2) Date: Jun. 4, 2015

(87) PCT Pub. No.: WO2014/088238
PCT Pub. Date: Jun. 12, 2014

(65) Prior Publication Data
US 2015/0311239 A1   Oct. 29, 2015

(30) Foreign Application Priority Data

Dec. 4, 2012   (KR) .................. 10-2012-0139416

(51) Int. Cl.
*H01L 27/146* (2006.01)
*H04N 9/04* (2006.01)

(52) U.S. Cl.
CPC ..... *H01L 27/1463* (2013.01); *H01L 27/14621* (2013.01); *H01L 27/14625* (2013.01);*H01L27/14627* (2013.01); *H01L 27/14645* (2013.01); *H01L 27/14649* (2013.01); *H01L 27/14685* (2013.01); *H01L 27/14689* (2013.01); *H04N 9/045* (2013.01)

(58) Field of Classification Search
CPC .................. H01L 27/1463; H01L 27/14621; H01L 27/14625; H01L 27/14627; H01L 27/14645; H01L 27/14649; H01L 27/14685; H01L 27/14689; H04N 9/045
See application file for complete search history.

(56) References Cited

U.S. PATENT DOCUMENTS

| | | | |
|---|---|---|---|
| 2007/0024879 A1* | 2/2007 | Hamilton, Jr. ......... | H04N 9/045 358/1.9 |
| 2008/0296713 A1* | 12/2008 | Lee ................... | H01L 27/14621 257/432 |
| 2011/0074960 A1* | 3/2011 | Nagata .............. | H01L 27/14621 348/164 |

FOREIGN PATENT DOCUMENTS

| | | |
|---|---|---|
| JP | 2011-77410 | 4/2011 |
| KR | 10-0821477 | 4/2008 |

OTHER PUBLICATIONS

KR100821477 Translation.*
(Continued)

*Primary Examiner* — Whitney T Moore
(74) *Attorney, Agent, or Firm* — IP & T Group LLP

(57) ABSTRACT

The present invention relates to a CMOS image sensor including an infrared pixel with enhanced spectral characteristics in which a stepped portion is formed between color filters of RGB pixels and a filter of an infrared pixel, and a manufacturing method thereof. A stepped portion is formed between color filters and an infrared filter according to respective pixels and the thicknesses of the filters are arbitrarily adjusted regardless of the characteristics of material in the formation of the color filters and the infrared filter, so that crosstalk characteristics are improved.

12 Claims, 10 Drawing Sheets

(56) References Cited

OTHER PUBLICATIONS

International Search Report for International Application No. PCT/KR2013/010396, dated Jan. 22, 2014.

Written Opinion with English translation for International Application No. PCT/KR2013/010396, dated Jan. 22, 2014.

\* cited by examiner

CMOS IMAGE SENSOR INCLUDING INFRARED PIXELS HAVING IMPROVED SPECTRAL PROPERTIES, AND METHOD OF MANUFACTURING SAME

The present invention relates to a CMOS image sensor and a manufacturing method thereof, and particularly, to a CMOS image sensor including an infrared pixel with enhanced spectral characteristics, in which a stepped portion is formed between color filters of RGB pixels and an IR filter of an IR pixel in order to minimize crosstalk in a visible ray area with respect to an infrared area in an image sensor including the IR pixel in addition to the RGB pixels, and a manufacturing method thereof.

BACKGROUND ART

In general, an image sensor is a semiconductor device that converts an optical image into an electrical signal, wherein a charge coupled device (CCD) is an element in which individual MOS (Metal-Oxide-Silicon) capacitors are very close to each other and a charge carrier is stored in the capacitor and is transported, and a CMOS image sensor is an element employing a switching scheme in which MOS transistors corresponding to the number of pixels are manufactured using a CMOS technology using a control circuit and a signal processing circuit as a peripheral circuit and output is sequentially detected using the MOS transistors.

In such an image sensor, color filters are arranged above a photodetection unit that receives light from an exterior and generates and accumulates photocharge, and a color filter array (CFA) may include three colors of a red, a green, and a blue, or three colors of a yellow, a magenta, and a cyan.

Basically, in order to express a color, a CMOS image sensor generally includes R (Red), G (Green), and B (Blue) pixels. However, the image sensor has a characteristic responding to light of an infrared area not visible by the human's eyes. Therefore, it is necessary to block light of a visible ray area and to allow only light of an infrared area to pass through, and in such a case, an infrared pixel is additionally used.

As described above, in order to optimize light efficiency of a CMOS image sensor including an infrared pixel, it is necessary to optimize microlens and filter layers for each pixel.

FIG. 1 is a diagram illustrating the arrangement of a unit pixel of a conventional CMOS image sensor including an infrared pixel, and FIG. 2 is a diagram schematically illustrating the section of the unit pixel of the conventional CMOS image sensor including the infrared pixel.

As illustrated in FIG. 2, the unit pixel of the conventional CMOS image sensor has a structure in which a photodetection layer 120, a metal interconnection layer 130, an insulating layer 140, a color filter layer 150, a transparent planar layer 160, and a microlens layer 170 are sequentially stacked on a semiconductor substrate 110.

The unit pixel of the conventional CMOS image sensor including the infrared pixel includes four red, green, blue, and infrared (IR) pixels as illustrated in FIG. 1, and color filters and an IR filter corresponding to the respective pixels are generally formed with no vertical stepped portion as illustrated in FIG. 2.

In general, according to the characteristics of a color filter, a difference occurs in crosstalk characteristics or purity characteristics according to the stacked thickness of the filter as illustrated in FIG. 4. For example, it can be understood that when the stacked thickness of the filter increases, crosstalk in a wavelength band to be cut off is reduced.

In the image sensor including the red, green, blue, and infrared (IR) pixels, each pixel shows spectral characteristics as illustrated in FIG. 3. In the IR pixel, a signal generated in a visible ray wavelength band, particularly, a band of 400 mm to 650 mm, causes crosstalk to degrade a depth of field (hereinafter, referred to as 'DOF') function in the infrared (IR) pixel. Also in the R, G, B pixels, the same phenomenon occurs.

In order to suppress crosstalk characteristics in a undesired wavelength band, it is necessary to improve filtering characteristics of a color filter. However, there is a limitation in arbitrarily changing the filtering characteristics so long as unique characteristics of color filter material do not change.

Furthermore, as illustrated in FIG. 2, when the color filter is formed with no vertical stepped portion, there is a limitation in thickness adjustment according to characteristics such as viscosity of material, resulting in the occurrence of purity reduction due to crosstalk of another color in a corresponding pixel.

DISCLOSURE

Technical Problem

Accordingly, the present invention has been made in an effort to solve the problems occurring in the related art, and an object of the present invention is to provide a CMOS image sensor including an infrared pixel with enhanced spectral characteristics, in which a stepped portion is formed between color filters and an infrared filter according to respective pixels and the thicknesses of the color filters and the infrared filter are arbitrarily adjusted regardless of the characteristics of material in the formation of the color filters and the infrared filter, so that crosstalk characteristics are improved, and a manufacturing method thereof.

Technical Solution

In order to achieve the above object, according to one aspect of the present invention, there is provided a CMOS image sensor including a first color pixel for receiving light of a first color, a second color pixel for receiving light of a second color, a third color pixel for receiving light of a third color, and an infrared pixel for receiving light of an infrared area, wherein thicknesses of a first color filter corresponding to the first color pixel, a second color filter corresponding to the second color pixel, a third color filter corresponding to the third color pixel, and an infrared filter corresponding to the infrared pixel are different from one another.

In order to achieve the above object, according to one aspect of the present invention, there is provided a CMOS image sensor CMOS image sensor including an infrared pixel with enhanced spectral characteristics, including: a photodetection layer formed over a semiconductor substrate and including a first photodiode for receiving light of a first color, a second photodiode for receiving light of a second color with a wavelength longer than that of the first color, a third photodiode for receiving light of a third color with a wavelength longer than that of the second color, and a fourth photodiode for receiving light of an infrared area; a metal interconnection layer formed over the photodetection layer; an insulating layer formed over the metal interconnection layer; a color filter layer formed over the insulating layer and including a first color filter, a second color filter, a third color filter, and an infrared filter formed at positions respectively corresponding to the first photodiode, the second photodiode, the third photodiode, and the fourth photodiode; a transparent planar layer formed over the color filter layer; and a microlens layer formed over the transparent planar layer and including a first microlens, a second microlens, a third microlens, and a fourth microlens formed at positions respectively corresponding to the first color filter, the second color filter, the third color filter, and the infrared filter, wherein thicknesses of the first color filter, the second color filter, the third color filter, and the infrared filter are different from one another.

In order to achieve the above object, according to another aspect of the present invention, there is provided a CMOS image sensor CMOS image sensor including an infrared pixel with enhanced spectral characteristics, including: a photodetection layer formed over a semiconductor substrate and including a first photodiode for receiving light of a first color, a second photodiode for receiving light of a second color with a wavelength longer than that of the first color, a third photodiode for receiving light of a third color with a wavelength longer than that of the second color, and a fourth photodiode for receiving light of an infrared area; a metal interconnection layer formed over the photodetection layer; an insulating layer formed over the metal interconnection layer; a first transparent planar layer formed over the insulating layer; a color filter layer formed over the first transparent planar layer and including a first color filter, a second color filter, a third color filter, and an infrared filter formed at positions respectively corresponding to the first photodiode, the second photodiode, the third photodiode, and the fourth photodiode; a second transparent planar layer formed over the color filter layer; and a microlens layer formed over the second transparent planar layer and including a first microlens, a second microlens, a third microlens, and a fourth microlens formed at positions respectively corresponding to the first color filter, the second color filter, the third color filter, and the infrared filter, wherein thicknesses of the first color filter, the second color filter, the third color filter, and the infrared filter are different from one another.

In order to achieve the above object, according to one aspect of the present invention, there is provided a manufacturing method of a CMOS image sensor CMOS image sensor including an infrared pixel with enhanced spectral characteristics, including: a photodetection layer formation step of forming a photodetection layer including a first photodiode for receiving light of a first color, a second photodiode for receiving light of a second color with a wavelength longer than that of the first color, a third photodiode for receiving light of a third color with a wavelength longer than that of the second color, and a fourth photodiode for receiving light of an infrared area over a semiconductor substrate; a metal interconnection layer formation step of forming a metal interconnection layer over the photodetection layer; an insulating layer formation step of forming an insulating layer over the metal interconnection layer; an etching step of etching a part of the insulating layer; a color filter layer formation step of forming a color filter layer including a first color filter, a second color filter, a third color filter, and an infrared filter formed at positions respectively corresponding to the first photodiode, the second photodiode, the third photodiode, and the fourth photodiode over the insulating layer with the etched part; a transparent planar layer formation step of forming a transparent planar layer over the color filter layer; and a microlens layer formation step of forming a microlens layer including a first microlens, a second microlens, a third microlens, and a fourth microlens formed at positions respectively corresponding to the first color filter, the second color filter, the third color filter, and the infrared filter over the transparent planar layer, wherein thicknesses of the first color filter, the second color filter, the third color filter, and the infrared filter formed in the color filter layer formation step are different from one another.

In order to achieve the above object, according to another aspect of the present invention, there is provided a manufacturing method of a CMOS image sensor CMOS image sensor including an infrared pixel with enhanced spectral characteristics, including: a photodetection layer formation step of forming a photodetection layer including a first photodiode for receiving light of a first color, a second photodiode for receiving light of a second color with a wavelength longer than that of the first color, a third photodiode for receiving light of a third color with a wavelength longer than that of the second color, and a fourth photodiode for receiving light of an infrared area over a semiconductor substrate; a metal interconnection layer formation step of forming a metal interconnection layer over the photodetection layer; an insulating layer formation step of forming an insulating layer over the metal interconnection layer; a first transparent planar layer formation step of forming a first transparent planar layer over the insulating layer; an etching step of etching a part of the first transparent planar layer; a color filter layer formation step of forming a color filter layer including a first color filter, a second color filter, a third color filter, and an infrared filter formed at positions respectively corresponding to the first photodiode, the second photodiode, the third photodiode, and the fourth photodiode over the first transparent planar layer; a second transparent planar layer formation step of forming a second transparent planar layer over the color filter layer; and a microlens layer formation step of forming a microlens layer including a first microlens, a second microlens, a third microlens, and a fourth microlens formed at positions respectively corresponding to the first color filter, the second color filter, the third color filter, and the infrared filter over the second transparent planar layer, wherein thicknesses of the first color filter, the second color filter, the third color filter, and the infrared filter formed in the color filter layer formation step are different from one another.

Advantageous Effects

In accordance with a CMOS image sensor including an infrared pixel with enhanced spectral characteristics and a manufacturing method thereof, a stepped portion is formed between color filters and an infrared filter according to respective pixels and the thicknesses of the filters are arbitrarily adjusted regardless of the characteristics of material in the formation of the color filters and the infrared filter, so that it is possible to improve cross characteristics.

BRIEF DESCRIPTION OF THE DRAWINGS

The above objects, and other features and advantages of the present invention will become more apparent after a reading of the following detailed description taken in conjunction with the drawings, in which.

BEST MODE FOR THE INVENTION

Figure 1:
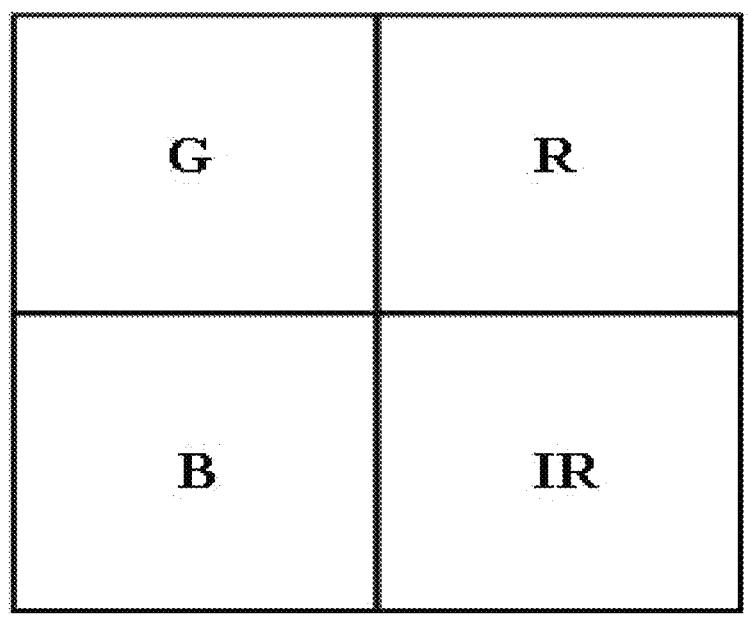
FIG. 1 is a diagram illustrating the arrangement of a unit pixel of a conventional CMOS image sensor including an infrared pixel.
Figure 2:
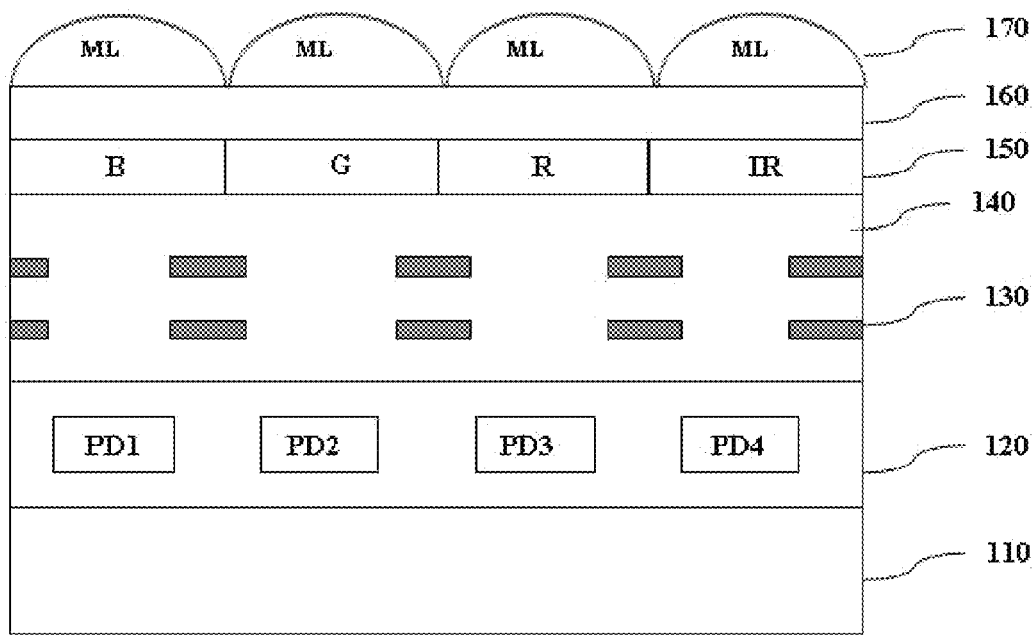
FIG. 2 is a diagram schematically illustrating the section of a unit pixel of a conventional CMOS image sensor including an infrared pixel.
Figure 3:
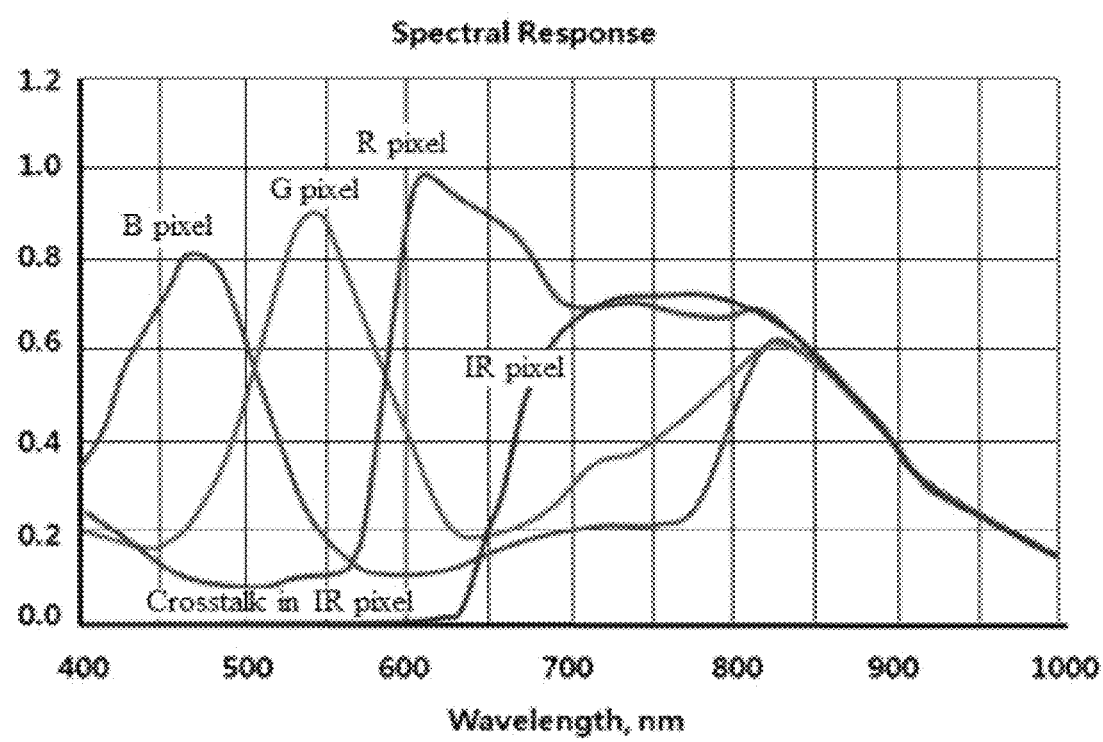
FIG. 3 is a diagram illustrating spectral characteristics of each pixel in a conventional CMOS image sensor including an infrared pixel.
Figure 4:
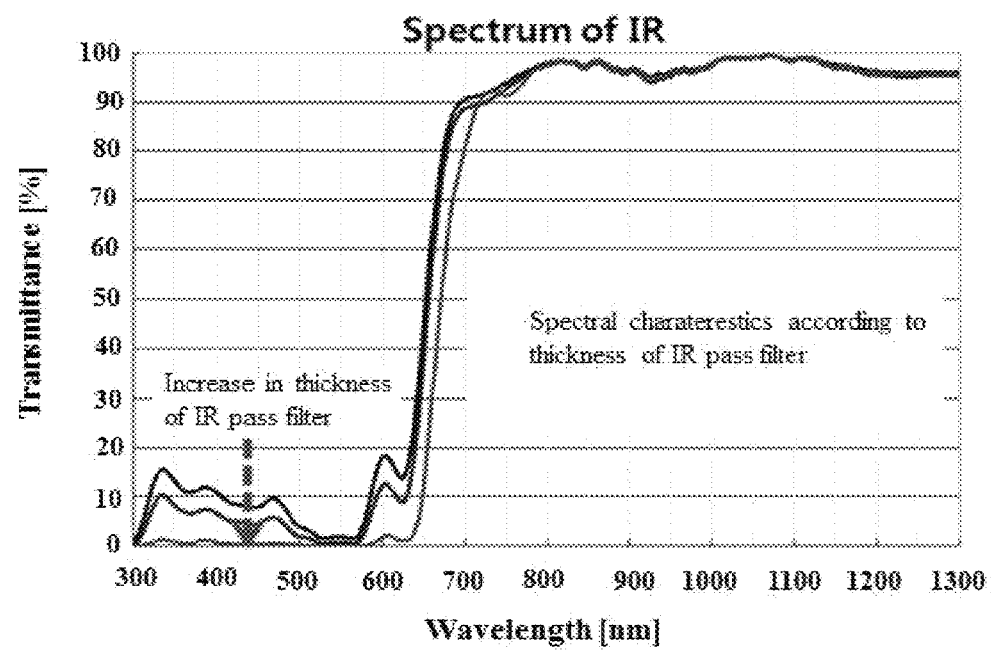
FIG. 4 is a diagram illustrating spectral characteristics according to a stacked thickness of an infrared filter in a conventional CMOS image sensor including an infrared pixel.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 5:
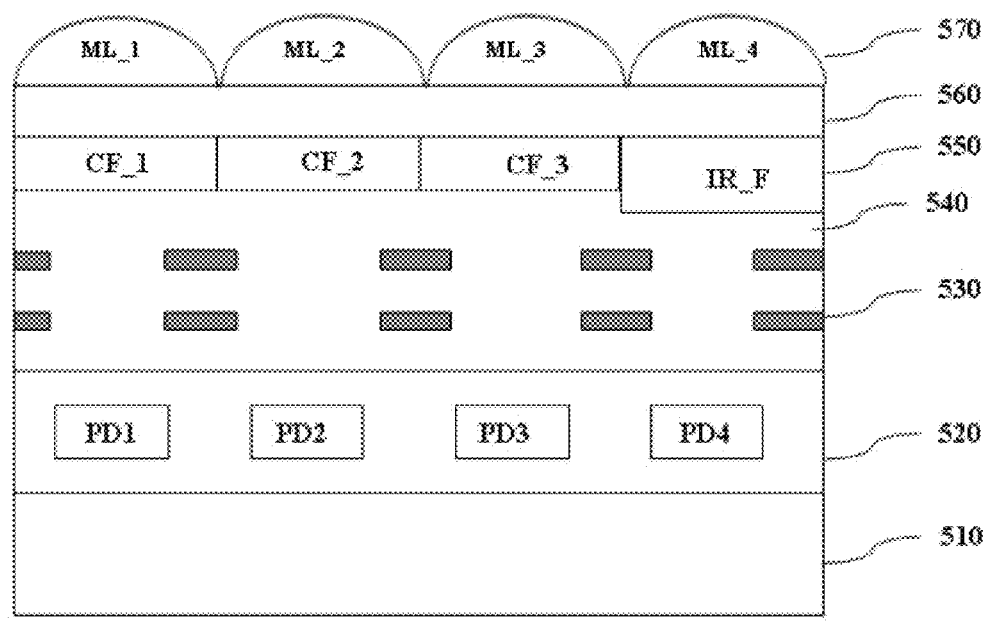
FIG. 5 is a diagram illustrating the section of a unit pixel of a CMOS image sensor including an infrared pixel with enhanced spectral characteristics according to one embodiment of the present invention.

FIG. 5 is a diagram illustrating the section of a unit pixel of a CMOS image sensor including an infrared pixel with enhanced spectral characteristics according to one embodiment of the present invention.

Referring to FIG. 5, a CMOS image sensor 500 including an infrared pixel with enhanced spectral characteristics according to the present invention has a structure in which a semiconductor substrate 510, a photodetection layer 520, a metal interconnection layer 530, an insulating layer 540, a color filter layer 550, a transparent planar layer 560, and a microlens layer 570 are sequentially stacked.

The photodetection layer 520 is formed on the semiconductor substrate 510, and includes a first photodiode PD_1 for receiving light of a first color, a second photodiode PD_2 for receiving light of a second color with a wavelength longer than that of the first color, a third photodiode PD_3 for receiving light of a third color with a wavelength longer than that of the second color, and a fourth photodiode PD_4 for receiving light of an infrared area.

The first color, the second color, and the third color may respectively use a blue (B) color, a green (G) color, and a red (R) color, and may also respectively use a cyan, a magenta, and a yellow according to necessity.

The metal interconnection layer 530 is formed on the photodetection layer 520 and includes a metal line for electrical connection. The insulating layer 540 is formed on the metal interconnection layer 530.

The color filter layer 550 is formed on the insulating layer 540, and includes a first color filter CF_1, a second color filter CF_2, a third color filter CF_3, and an infrared filter IR_F formed at positions respectively corresponding to the first photodiode PD_1, the second photodiode PD_2, the third photodiode PD_3, and the fourth photodiode PD_4.

The transparent planar layer 560 is formed on the color filter layer 550.

The microlens layer 570 is formed on the transparent planar layer 560, and includes a first microlens ML_1, a second microlens ML_2, a third microlens ML_3, and a microlens ML_4 formed at positions respectively corresponding to the first color filter CF_1, the second color filter CF_2, the third color filter CF_3, and the infrared filter IR_F.

Figure 6:
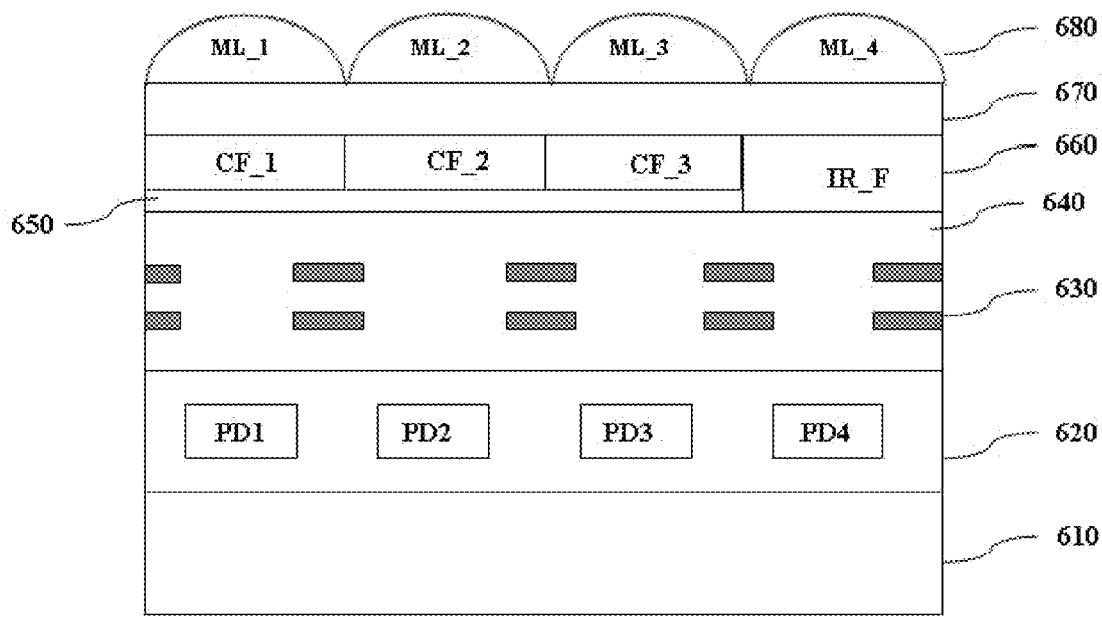
FIG. 6 is a diagram illustrating the section of a unit pixel of a CMOS image sensor including an infrared pixel with enhanced spectral characteristics according to another embodiment of the present invention.
Figure 7:
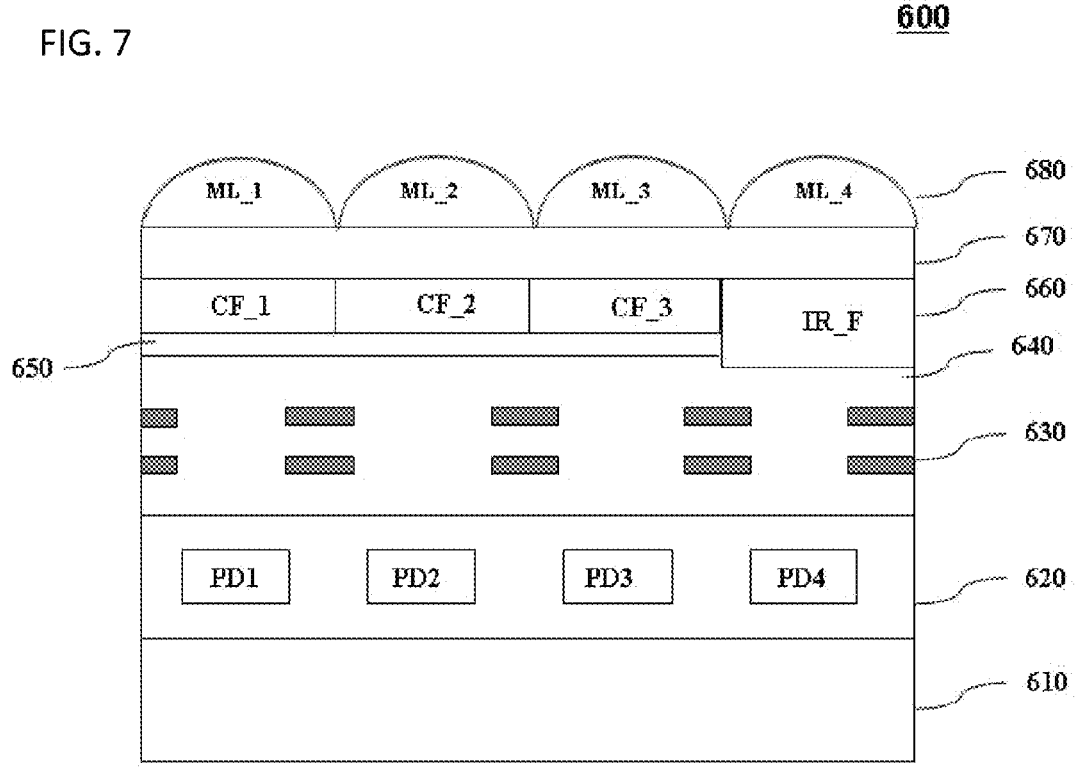
FIG. 7 is a diagram illustrating the section of a unit pixel of a CMOS image sensor including an infrared pixel with enhanced spectral characteristics according to another embodiment of the present invention.
Figure 8:
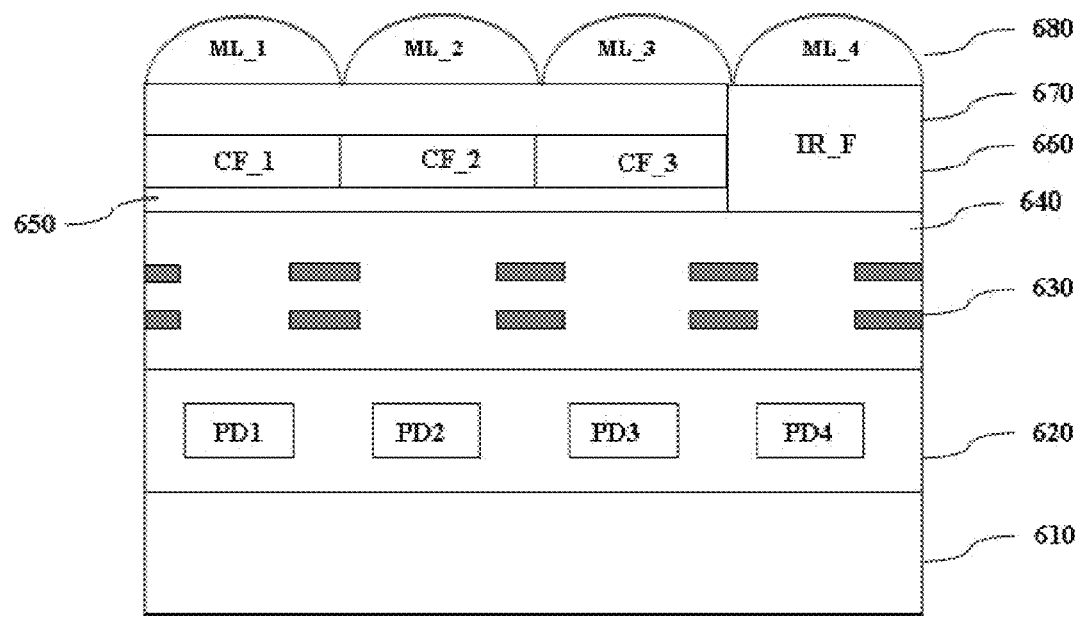
FIG. 8 is a diagram illustrating the section of a unit pixel of a CMOS image sensor including an infrared pixel with enhanced spectral characteristics according to another embodiment of the present invention.

FIG. 6 to FIG. 8 are diagrams illustrating the section of the unit pixel of the CMOS image sensor including the infrared pixel with enhanced spectral characteristics according to another embodiment of the present invention.

Referring to FIG. 6 to FIG. 8, a CMOS image sensor 600 including an infrared pixel with enhanced spectral characteristics according to another embodiment of the present invention has a structure in which a semiconductor substrate 610, a photodetection layer 620, a metal interconnection layer 630, an insulating layer 640, a first transparent planar layer 650, a color filter layer 660, a second transparent planar layer 670, and a microlens layer 680 are sequentially stacked.

Since the CMOS image sensor 600 is equal to the CMOS image sensor illustrated in FIG. 5 except that the first transparent planar layer 650 is additionally formed on the insulating layer 640, a detailed description thereof will be omitted.

As illustrated in FIG. 5 to FIG. 8, in the CMOS image sensors according to the present invention, the thicknesses of the color filter layers of pixels according to each color different from one another.

That is, the thickness of the first color filter CF_1 corresponding to the first photodiode PD_1 for receiving the blue color (the first color) and the thicknesses of the second color filter CF_2 and the third color filter CF_3 corresponding to the second photodiode PD_2 and the third photodiode PD_3 for receiving the green color (the second color) and the red color (the third color) are different from the thickness of the infrared filter IR_F corresponding to the fourth photodiode PD_4 for receiving infrared rays.

FIG. 5 to FIG. 8 illustrate that the thickness of the infrared filter IR_F is thicker than the thicknesses of the first color filter CF_1, the second color filter CF_2, and the third color filter CF_3, and the thicknesses of the first color filter CF_1, the second color filter CF_2, and the third color filter CF_3 are equal to one another, but vice versa. Furthermore, it is of course that the thicknesses of the respective filters may be formed to be different from one another.

Figure 9:
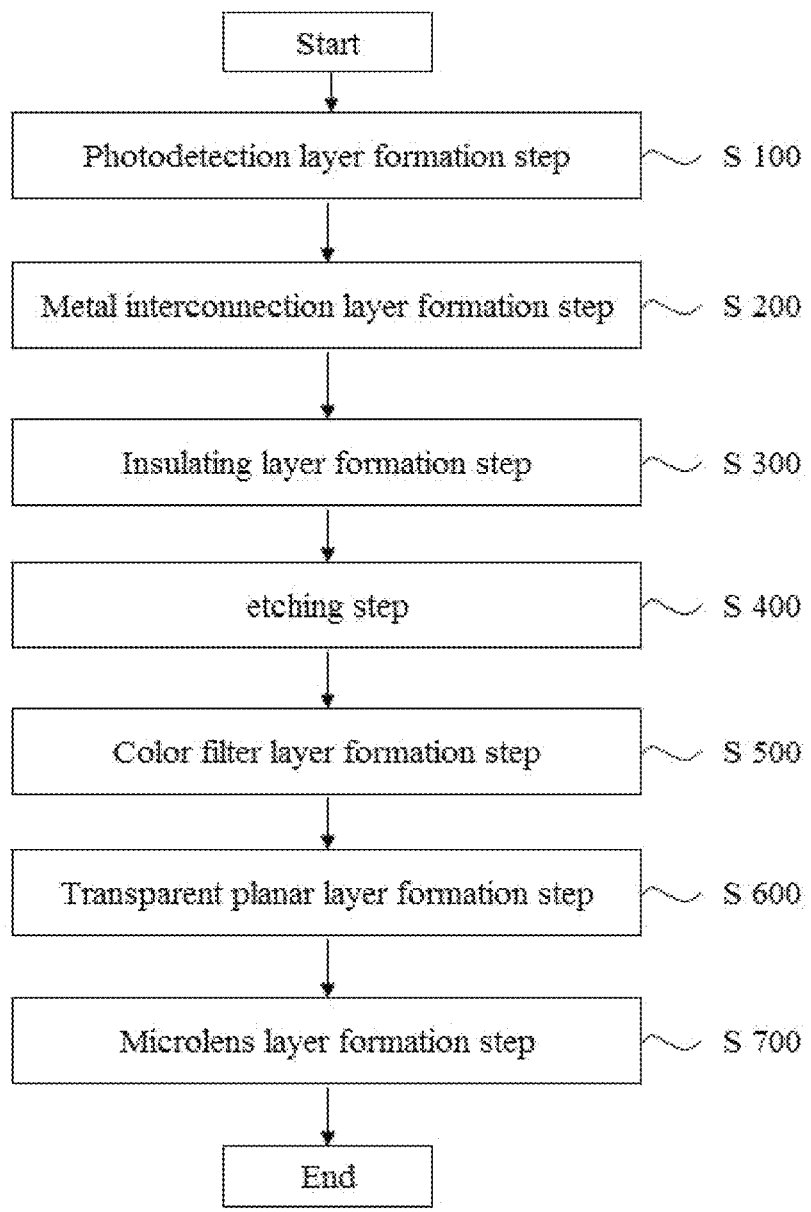
FIG. 9 is a flowchart illustrating a procedure of a manufacturing method of a CMOS image sensor including an infrared pixel with enhanced spectral characteristics according to one embodiment of the present invention.

FIG. 9 is a flowchart illustrating a procedure of a manufacturing method of the CMOS image sensor including the infrared pixel with enhanced spectral characteristics according to one embodiment of the present invention as illustrated in FIG. 5.

As illustrated in FIG. 9, the manufacturing method of the CMOS image sensor including the infrared pixel with enhanced spectral characteristics according to one embodiment of the present invention includes a photodetection layer formation step S100, a metal interconnection layer formation step S200, an insulating layer formation step S300, an etching step S400, a color filter layer formation step S500, a transparent planar layer formation step S600, and a microlens layer formation step 700.

In the photodetection layer formation step S100, a photodetection layer including a first photodiode for receiving light of a first color, a second photodiode for receiving light of a second color with a wavelength longer than that of the first color, a third photodiode for receiving light of a third color with a wavelength longer than that of the second color, and a fourth photodiode for receiving infrared rays is formed on a semiconductor substrate.

In the metal interconnection layer formation step S200, a metal interconnection layer is formed on the photodetection layer, and in the insulating layer formation step S300, an insulating layer is formed on the metal interconnection layer.

In the etching step S400, a part of the insulating layer is etched using a dry etching or wet etching process with respect to respective areas in which the filter characteristics of color filters are to be improved before the color filters are formed.

That is, in the case of forming the unit pixel with the structure illustrated in FIG. 5, the insulating layer of an area corresponding to the infrared pixel is etched to form a stepped portion, so that the thickness of an infrared filter can be formed to be thicker than the thicknesses of other color filters in a subsequent color filter formation step.

Then, in the color filter layer formation step S500, a color filter layer including a first color filter, a second color filter, a third color filter, and an infrared filter to be formed at positions respectively corresponding to the first photodiode, the second photodiode, the third photodiode, and the fourth photodiode is formed on the insulating layer with the etched part.

In the transparent planar layer formation step S600, a transparent planar layer is formed on the color filter layer.

In the microlens layer formation step 700, a microlens layer including a first microlens, a second microlens, a third microlens, and a fourth microlens to be formed at positions respectively corresponding to the first color filter, the second color filter, the third color filter, and the infrared filter is formed on the transparent planar layer.

Figure 10:
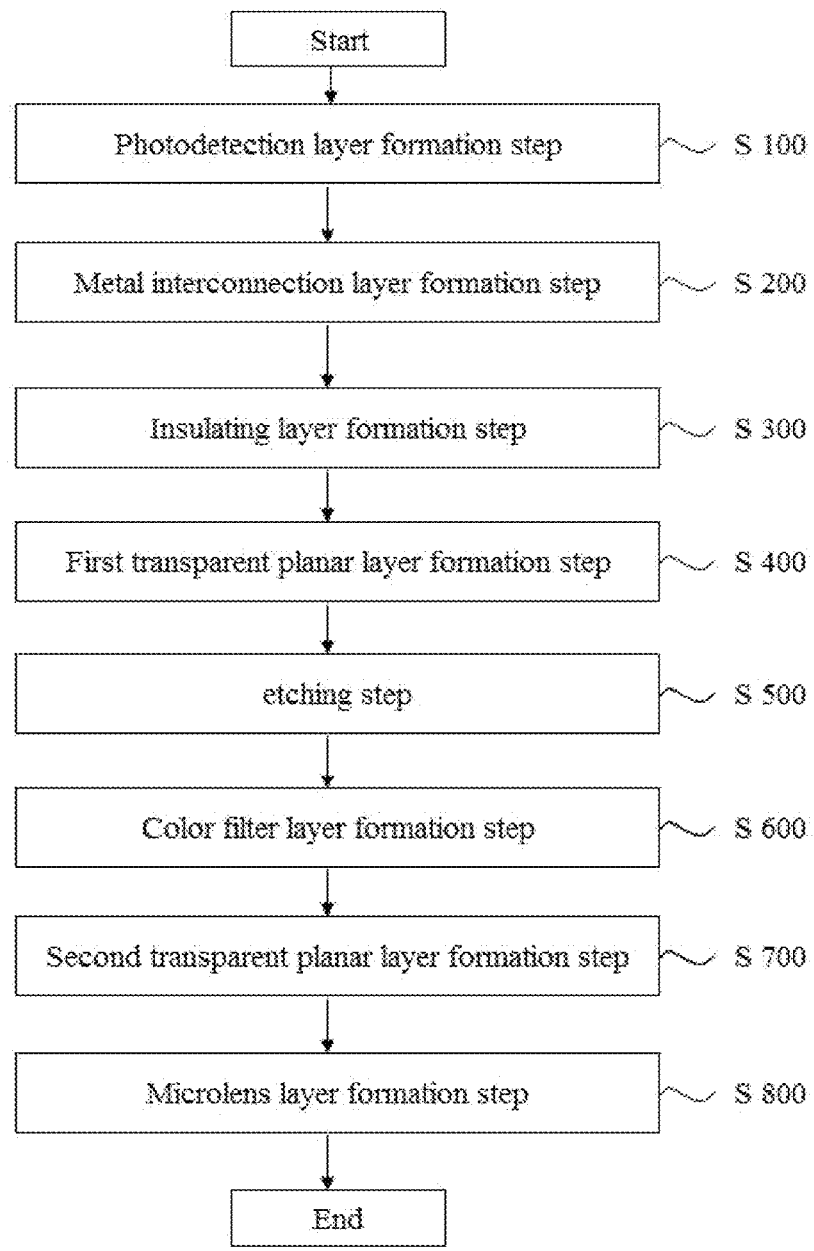
FIG. 10 is a flowchart illustrating a procedure of a manufacturing method of a CMOS image sensor including an infrared pixel with enhanced spectral characteristics according to another embodiment of the present invention.

FIG. 10 is a flowchart illustrating a procedure of a manufacturing method of the CMOS image sensor including the infrared pixel with enhanced spectral characteristics according to another embodiment of the present invention as illustrated in FIG. 6.

As illustrated in FIG. 10, the manufacturing method of the CMOS image sensor including the infrared pixel with enhanced spectral characteristics according to another embodiment of the present invention includes a photodetection layer formation step S100, a metal interconnection layer formation step S200, an insulating layer formation step S300, a first transparent planar layer formation step S400, an etching step S500, a color filter layer formation step S600, a second transparent planar layer formation step S700, and a microlens layer formation step 800.

Since the photodetection layer formation step S100, the metal interconnection layer formation step S200, the insulating layer formation step S300, the color filter layer formation step S600, the second transparent planar layer formation step S700, and the microlens layer formation step 800 are equal to those described in FIG. 9, a detailed description thereof will be omitted.

In the first transparent planar layer formation step S400, a first transparent planar layer is formed on the insulating layer.

In the etching step S500, a part of the first transparent planar layer is etched using a dry etching or wet etching process with respect to respective areas in which the filter characteristics of color filters are to be improved before the color filters are formed.

That is, in the case of forming the unit pixel with the structure illustrated in FIG. 6, the first transparent planar layer of an area corresponding to the infrared pixel is etched to form a stepped portion, so that the thickness of an infrared filter can be formed to be thicker than the thicknesses of other color filters in a subsequent color filter formation step.

Furthermore, in the case of forming the unit pixel with the structure illustrated in FIG. 7, a part of the insulating layer as well as the first transparent planar layer of an area corresponding to the infrared pixel are etched to form a stepped portion, so that the thickness of an infrared filter can be formed to be further thicker than the thicknesses of other color filters in a subsequent color filter formation step.

In addition, in the case of forming the unit pixel with the structure illustrated in FIG. 8, the first transparent planar layer of an area corresponding to the infrared pixel is etched to form a stepped portion, the thickness of an infrared filter is formed to be thicker than the thicknesses of other color filters in a subsequent color filter formation step, and a second transparent planar layer is formed on other color filters except for the infrared filter in the second transparent planar layer formation step, so that the thickness of the infrared filter can be formed to be further thicker than the thicknesses of the other color filters.

Although a preferred embodiment of the present invention has been described for illustrative purposes, those skilled in the art will appreciate that various modifications, additions and substitutions are possible, without departing from the scope and the spirit of the invention as disclosed in the accompanying claims.

The invention claimed is:

1. A CMOS image sensor CMOS image sensor including an infrared pixel with enhanced spectral characteristics, comprising:
    a photodetection layer formed over a semiconductor substrate and including a first photodiode for receiving light of a first color, a second photodiode for receiving light of a second color with a wavelength longer than that of the first color, a third photodiode for receiving light of a third color with a wavelength longer than that of the second color, and a fourth photodiode for receiving light of an infrared area;
    an interconnection layer formed over the photodetection layer;
    an insulating layer formed over the interconnection layer;
    a color filter layer formed over the insulating layer and including a first color filter, a second color filter, a third color filter, and an infrared filter formed at positions respectively corresponding to the first photodiode, the second photodiode, the third photodiode, and the fourth photodiode;
    a transparent planar layer formed over the color filter layer; and
    a microlens layer formed over the transparent planar layer and including a first microlens, a second microlens, a third microlens, and a fourth microlens formed at positions respectively corresponding to the first color filter, the second color filter, the third color filter, and the infrared filter,
    wherein the insulating layer of areas respectively corresponding to the first color filter, the second color filter, the third color filter and the infrared filter, has a stepped portion under the infrared filter so that each thickness of the first color filter, the second color filter and the third color filter are substantially the same, and a thickness of the infrared filter at the stepped portion is greater than each thickness of the first color filter, the second color filter and the third color filter.

2. The CMOS image sensor including the infrared pixel with enhanced spectral characteristics of claim 1, wherein the first color filter, the second color filter, and the third color filter are a blue color, a green color, and a red color, respectively.

3. The CMOS image sensor including the infrared pixel with enhanced spectral characteristics of claim 1, wherein the first color filter, the second color filter, and the third color filter are a cyan, a magenta, and a yellow, respectively.

4. A CMOS image sensor CMOS image sensor including an infrared pixel with enhanced spectral characteristics, comprising:
   a photodetection layer formed over a semiconductor substrate and including a first photodiode for receiving light of a first color, a second photodiode for receiving light of a second color with a wavelength longer than that of the first color, a third photodiode for receiving light of a third color with a wavelength longer than that of the second color, and a fourth photodiode for receiving light of an infrared area;
   an interconnection layer formed over the photodetection layer;
   an insulating layer formed over the interconnection layer;
   a first transparent planar layer formed over the insulating layer;
   a color filter layer formed over the first transparent planar layer and including a first color filter, a second color filter, a third color filter, and an infrared filter formed at positions respectively corresponding to the first photodiode, the second photodiode, the third photodiode, and the fourth photodiode;
   a second transparent planar layer formed over the color filter layer; and
   a microlens layer formed over the second transparent planar layer and including a first microlens, a second microlens, a third microlens, and a fourth microlens formed at positions respectively corresponding to the first color filter, the second color filter, the third color filter, and the infrared filter,
   wherein each thickness of the first color filter, the second color filter and the third color filter are substantially the same, and a thickness of the infrared filter is greater than each thickness of the first color filter, the second color filter and the third color filter, and
   wherein the first transparent layer is on a same plane as and adjacent to the infrared filter and has a thickness substantially equal to the infrared filter.

5. The CMOS image sensor including the infrared pixel with enhanced spectral characteristics of claim 4, wherein the first transparent planar layer and the insulating layer of areas respectively corresponding to the first color filter, the second color filter, the third color filter, and the infrared filter have a stepped portion by etching, so that the thicknesses of the first color filter, the second color filter, the third color filter, and the infrared filter are different from one another.

6. The CMOS image sensor including the infrared pixel with enhanced spectral characteristics of claim 4, wherein the first color filter, the second color filter, and the third color filter are a blue color, a green color, and a red color, respectively.

7. The CMOS image sensor including the infrared pixel with enhanced spectral characteristics of claim 4, wherein the first color filter, the second color filter, and the third color filter are a cyan, a magenta, and a yellow, respectively.

8. A manufacturing method of a CMOS image sensor CMOS image sensor including an infrared pixel with enhanced spectral characteristics, comprising:
   a photodetection layer foil nation step of forming a photodetection layer including a first photodiode for receiving light of a first color, a second photodiode for receiving light of a second color with a wavelength longer than that of the first color, a third photodiode for receiving light of a third color with a wavelength longer than that of the second color, and a fourth photodiode for receiving light of an infrared area over a semiconductor substrate;
   a metal interconnection layer formation step of forming a metal interconnection layer over the photodetection layer;
   an insulating layer formation step of forming an insulating layer over the metal interconnection layer;
   an etching step of etching a part of the insulating layer;
   a color filter layer formation step of forming a color filter layer including a first color filter, a second color filter, a third color filter, and an infrared filter formed at positions respectively corresponding to the first photodiode, the second photodiode, the third photodiode, and the fourth photodiode over the insulating layer with the etched part;
   a transparent planar layer formation step of forming a transparent planar layer over the color filter layer; and
   a microlens layer formation step of forming a microlens layer including a first microlens, a second microlens, a third microlens, and a fourth microlens formed at positions respectively corresponding to the first color filter, the second color filter, the third color filter, and the infrared filter over the transparent planar layer,
   wherein the insulating layer of areas respectively corresponding to the first color filter, the second color filter, the third color filter and the infrared filter, has a stepped portion under the infrared filter so that each thickness of the first color filter, the second color filter and the third color filter are substantially the same, and a thickness of the infrared filter formed in the color filter layer formation step, at the stepped portion is greater than each thickness of the first color filter, the second color filter and the third color filter.

9. A manufacturing method of a CMOS image sensor CMOS image sensor including an infrared pixel with enhanced spectral characteristics, comprising:
   a photodetection layer formation step of forming a photodetection layer including a first photodiode for receiving light of a first color, a second photodiode for receiving light of a second color with a wavelength longer than that of the first color, a third photodiode for receiving light of a third color with a wavelength longer than that of the second color, and a fourth photodiode for receiving light of an infrared area over a semiconductor substrate;
   a metal interconnection layer formation step of forming a metal interconnection layer over the photodetection layer;
   an insulating layer formation step of forming an insulating layer over the metal interconnection layer;
   a first transparent planar layer formation step of forming a first transparent planar layer over the insulating layer;
   an etching step of etching a part of the first transparent planar layer;

a color filter layer formation step of forming a color filter layer including a first color filter, a second color filter, a third color filter, and an infrared filter formed at positions respectively corresponding to the first photodiode, the second photodiode, the third photodiode, and the fourth photodiode over the first transparent planar layer;

a second transparent planar layer formation step of forming a second transparent planar layer over the color filter layer; and a microlens layer formation step of forming a microlens layer including a first microlens, a second microlens, a third microlens, and a fourth microlens formed at positions respectively corresponding to the first color filter, the second color filter, the third color filter, and the infrared filter over the second transparent planar layer, wherein each thickness of the first color filter, the second color filter and the third color filter are substantially the same, and a thickness of the infrared filter formed in the color filter layer formation step is greater than each thickness of the first color filter, the second color filter and the third color filter, and wherein the first transparent layer is on a same plane as and adjacent to the infrared filter and has a thickness substantially equal to the infrared filter.

10. The manufacturing method of the CMOS image sensor including the infrared pixel with enhanced spectral characteristics of claim 9, wherein in the etching step, etching depths of the first transparent planar layer of areas, in which the first color filter, the second color filter, the third color filter, and the infrared filter are formed, are allowed to be different from one another to form a stepped portion, so that the thicknesses of the first color filter, the second color filter, the third color filter, and the infrared filter are formed to be different from one another.

11. The manufacturing method of the CMOS image sensor including the infrared pixel with enhanced spectral characteristics of claim 9, wherein in the etching step, etching depths of the insulating layer and the first transparent planar layer of areas, in which the first color filter, the second color filter, the third color filter, and the infrared filter are formed, are allowed to be different from one another to form a stepped portion, so that the thicknesses of the first color filter, the second color filter, the third color filter, and the infrared filter are formed to be different from one another.

12. The manufacturing method of the CMOS image sensor including the infrared pixel with enhanced spectral characteristics of claim 11, wherein in the etching step, etching depths of an insulating layer and a first transparent planar layer of areas, in which the infrared filter is formed, are allowed to be deeper than etching depths of an insulating layer and a first transparent planar of an area, in which the first color filter, the second color filter, and the third color filter are formed, and the respective insulating layers and first transparent planar layers have a stepped portion, so that the thickness of the infrared filter is formed to be further thicker than the thicknesses of the first color filter, the second color filter, and the third color filter.

* * * * *